United States Patent [19]
Ohbayashi et al.

[11] Patent Number: 5,274,597
[45] Date of Patent: Dec. 28, 1993

[54] SEMICONDUCTOR MEMORY DEVICE CAPABLE OF DRIVING DIVIDED WORD LINES AT HIGH SPEED

[75] Inventors: Shigeki Ohbayashi; Atsushi Ohba; Toru Shiomi, all of Hyogo, Japan

[73] Assignee: Mitsubishi Denki Kabushiki Kaisha, Tokyo, Japan

[21] Appl. No.: 767,315

[22] Filed: Sep. 30, 1991

[30] Foreign Application Priority Data

Oct. 4, 1990 [JP] Japan .................................. 2-268886

[51] Int. Cl.$^5$ ................................................ G11C 7/00
[52] U.S. Cl. .................................... 365/204; 307/451; 365/230.03
[58] Field of Search ................... 307/451; 365/230.03, 365/204

[56] References Cited

U.S. PATENT DOCUMENTS 4,516,224  5/1985  Aoyama ........................... 365/233.5
4,710,649  12/1987  Lewis ................................. 307/451

FOREIGN PATENT DOCUMENTS 62-58077  12/1987  Japan .
63-8556  2/1988  Japan .

OTHER PUBLICATIONS

ISSCC Digest of Technical Papers, by Aizaki et al., entitled "A 15ns 4 Mb CMOS SRAM", Feb. 19, 1990, pp. 126-127.

Primary Examiner—Eugene R. LaRoche
Assistant Examiner—Christopher R. Glembocki
Attorney, Agent, or Firm—Lowe, Price, LeBlanc & Becker

[57] ABSTRACT

A divided word line driving circuit applicable to a static random access memory (SRAM) employing a divided word line method is disclosed. When a divided word line is activated, the potential at the input of an inverter for driving the word line is brought to a low level. When the input signals S1 and S2 are both at a low level, the divided word line is brought to an inactive state. The input of the inverter is charged by a transistor 101 in addition to a transistor 102 which is always on. In other words, transistor 101 contributes to accelerating charging of the input of the inverter. Consequently, the potential of the divided word line is made to rise at high speed, so that access operation at high speed can be achieved. The circuit is implemented with a small number of transistors, so that it becomes also possible to enhance the degree of integration of a SRAM.

18 Claims, 8 Drawing Sheets

FIG.11 ple of a conventional SRAM employing the divided word line method. A SRAM 200 illustrated in FIG. 2 is different from SRAM 100 illustrated in FIG. 1 in that a global decoder 1' is provided between memory cell array blocks 4b and 4c. Global decoder 1' is provided in the middle of memory cell array blocks 4a to 4d on a semiconductor substrate, so that it is possible to reduce the total length of wiring of main word lines MWL1 to MWLn and to achieve operation at a higher speed than that of SRAM 100 illustrated in FIG. 1.

SEMICONDUCTOR MEMORY DEVICE CAPABLE OF DRIVING DIVIDED WORD LINES AT HIGH SPEED

BACKGROUND OF THE INVENTION

1. Field of the Invention

The present invention relates generally to semiconductor memory devices, and, more particularly, to a semiconductor memory device employing a divided word line method. The present invention has particular applicability to static random access memories (SRAMs).

2. Description of the Background Art

A divided word line method is generally employed in semiconductor memories for driving or activating a word line having a long length of wiring at high speed. According to the divided word line method, conventional word lines are divided into a main word line for selecting a memory cell region and divided word lines for selecting individual memory cell rows. Description of a static random access memory (hereinafter referred to as "SRAM") will be given in the following as an example of a semiconductor memory employing the divided word line method.

Figure 1:
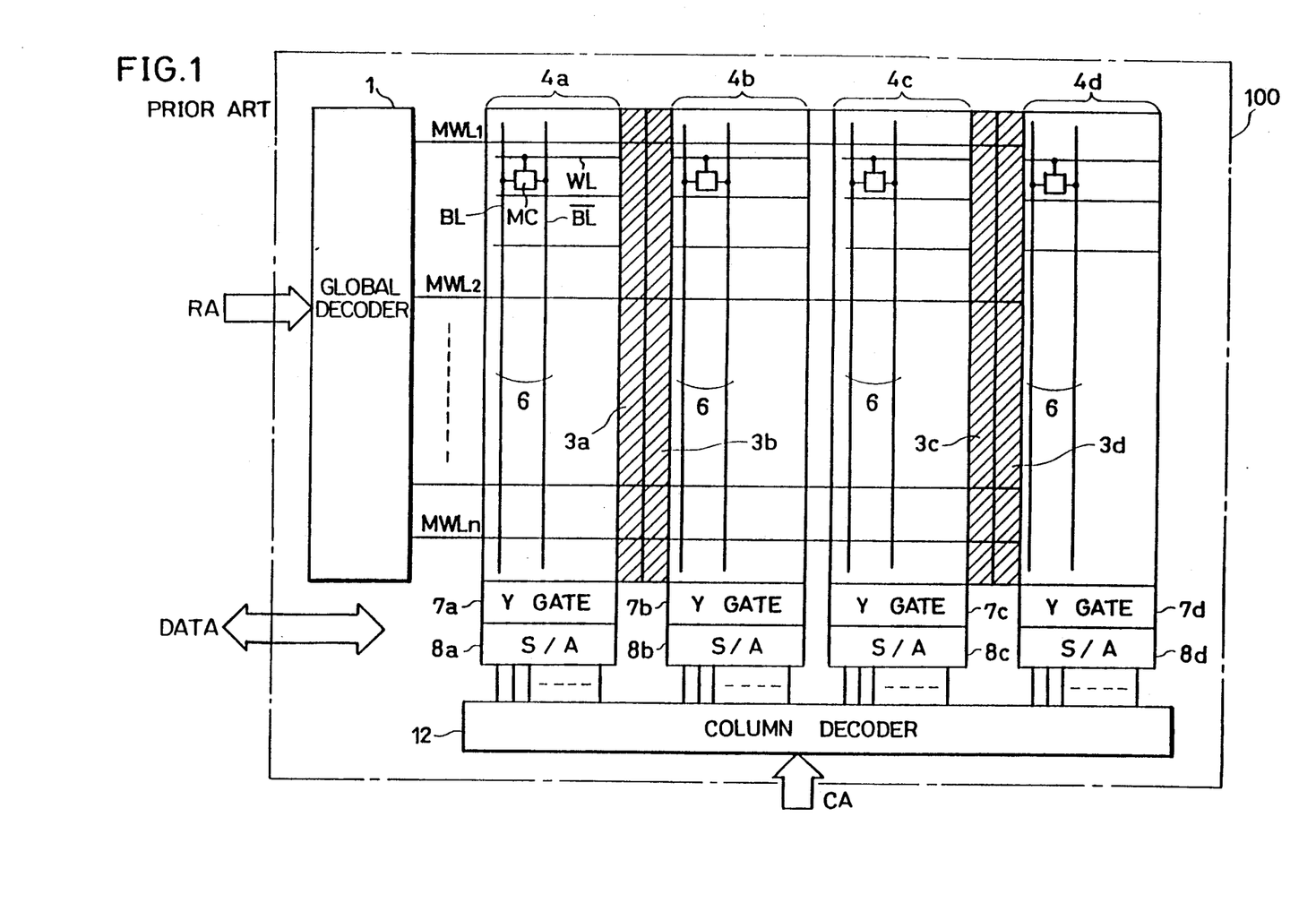
FIG. 1 is a block diagram of a conventional SRAM employing a divided word line method.
Figure 2:
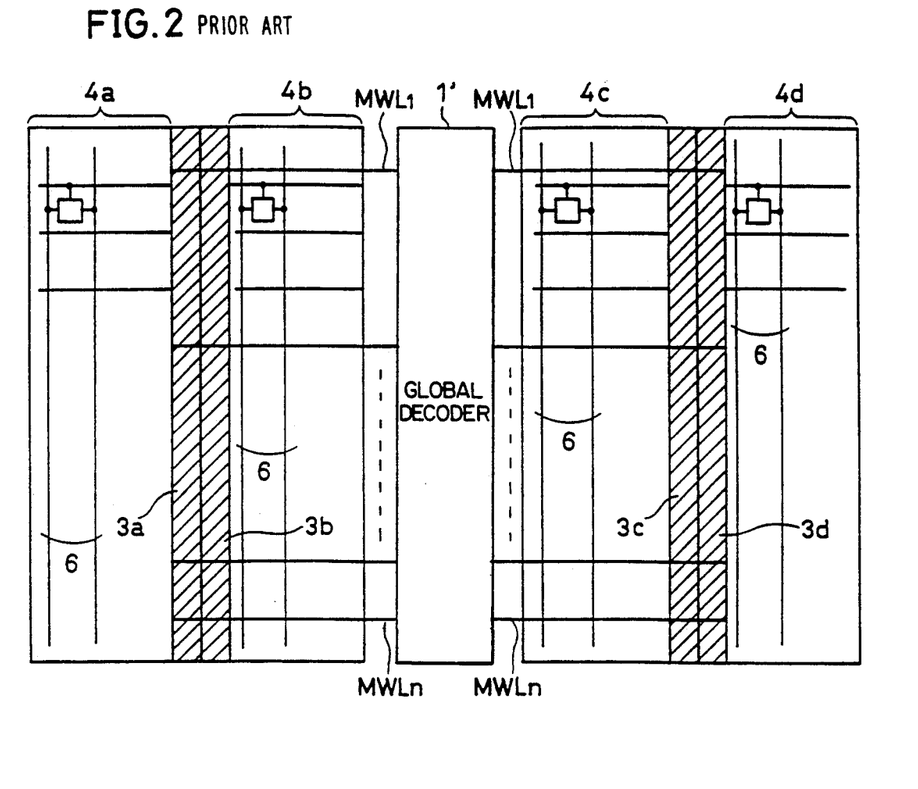
FIG. 2 is a block diagram illustrating another example of a conventional SRAM employing the divided word line method.

FIG. 1 is a block diagram of a conventional SRAM employing the divided word line method. Japanese Patent Publication No. 63-8556 (1988) shows a block diagram similar to the one illustrated in FIG. 1. Referring to FIG. 1, a SRAM 100 includes memory cell array blocks 4a to 4d divided into four parts, local decoders 3a to 3d each connected to a corresponding memory cell array block, and a global decoder 1 connected through main word lines MWL1 to MWLn to respective local decoders 3a to 3d. Global decoder 1 drives or activates one of main word lines MWL1 to MWLn in response to an externally applied row address signal RA. Each of memory cell array blocks 4a to 4d includes memory cells arranged in rows and columns. Memory cells arranged in one row in each of memory cell array blocks 4a to 4d are connected to one divided word line WL. In addition, memory cells arranged in one column is connected to a bit line pair BL, $\overline{BL}$.

SRAM 100 further includes Y gate circuits 7a to 7d each connected to corresponding one of memory cell array blocks 4a to 4d, sense amplifiers 8a to 8d each connected to corresponding one of memory cell array blocks 4a to 4d, and a column decoder 12. Sense amplifiers 8a to 8d amplify a small potential difference appearing between bit lines BL, $\overline{BL}$. Column decoder 12 selectively turns on a switching transistor (not shown) in Y gate circuits 7a to 7d in response to an externally applied column address signal CA.

FIG. 2 is a block diagram illustrating another example of a conventional SRAM employing the divided word line method. A SRAM 200 illustrated in FIG. 2 is different from SRAM 100 illustrated in FIG. 1 in that a global decoder 1' is provided between memory cell array blocks 4b and 4c. Global decoder 1' is provided in the middle of memory cell array blocks 4a to 4d on a semiconductor substrate, so that it is possible to reduce the total length of wiring of main word lines MWL1 to MWLn and to achieve operation at a higher speed than that of SRAM 100 illustrated in FIG. 1.

Figure 3A:
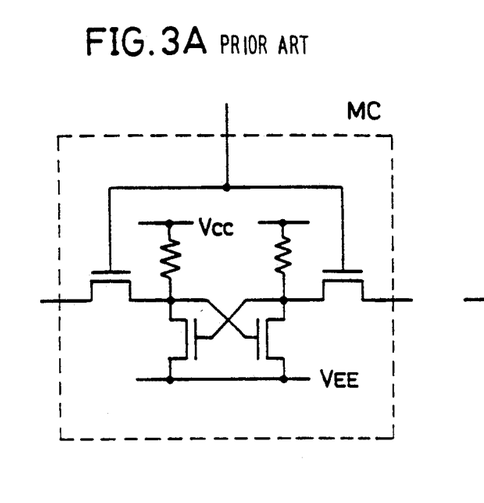
FIGS. 3A and 3B are circuit diagrams of memory cells applicable to the SRAMs illustrated in FIGS. 1 and 2.
Figure 3B:
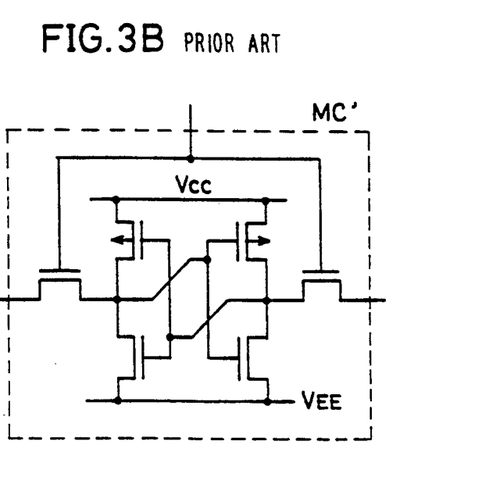

FIG. 3A is a circuit diagram of a memory cell MC applicable to SRAMs 100 and 200 illustrated in FIGS. 1 and 2. FIG. 3B is a circuit diagram of a memory cell MC' applicable to SRAMs 100 and 200 as a substitute for memory cell MC illustrated in FIG. 3A.

Figure 4:
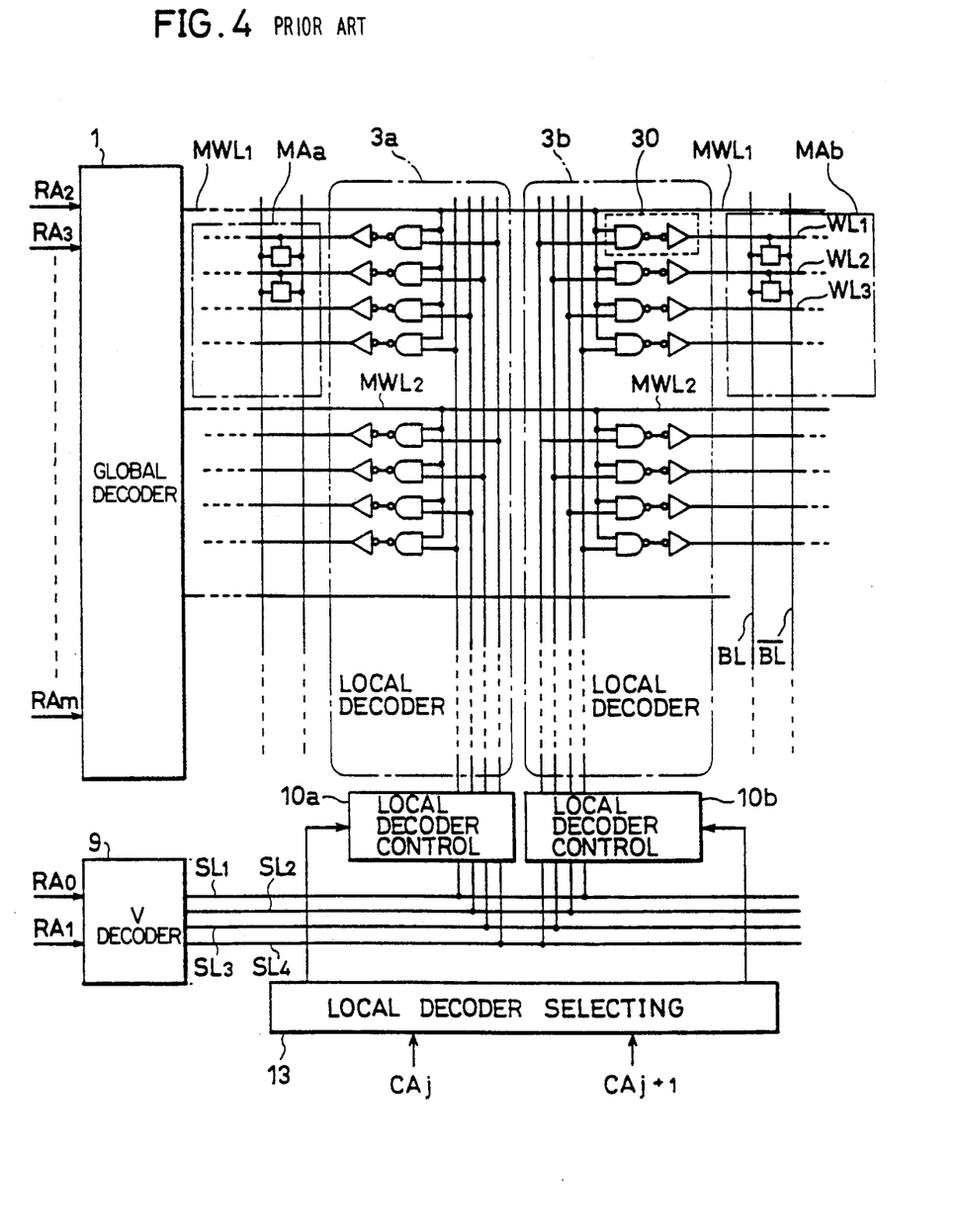
FIG. 4 is a circuit diagram of local decoders illustrated in FIG. 1.

FIG. 4 is a circuit diagram of local decoders 3a and 3b illustrated in FIG. 1. Referring to FIG. 4, local decoder 3b, for example, includes divided word line driving circuits each driving or activating corresponding one of divided word lines WL1, WL2, . . . . A divided word line driving circuit 30 is implemented with an NAND gate and an inverter and drives word line WL1. A global decoder 1 decodes more significant bits R'A2 to RAm of an externally applied row address signal to selectively drive main word lines MWL1, MWL2 . . . . A two-bit decoder 9 referred to as "V decoder" decodes less significant two bits RA0 and RA1 of the row address signal to selectively drive signal lines SL1 to SL4. A local decoder selecting circuit 13 decodes predetermined two bits CAj and Caj+1 of an externally applied column address signal to apply a selecting signal for selecting one of memory cell array block 3a and memory cell array block 3b to local decoder controlling circuits 10a and 10b. Each of local decoder controlling circuits 10a and 10b is responsive to the selecting signal applied from local decoder selecting circuit 13 for applying output signals SL1 to SL4 provided from V decoder 9 to corresponding one of memory cell array blocks 3a and 3b.

It is pointed out that one output signal line of global decoder 1, main word line MWL1, for example, selects memorycell regions MAa and MAb. Specifically, activation of main word line MWL1 causes memory cell regions MAa and MAb accessible through local decoders 3a and 3b to be determined.

Now, operation of the circuit illustrated in FIG. 4 will be described. A case where divided word line WL1 in memory cell region MAb is driven will be described as an example in the following. Global decoder 1 is responsive to more significant bits RA2 and RAm of a row address signal for selectively activating main word line MWL1. On the other hand, V decoder 9 is responsive to less significant bits RA0 and R1 of the row address signal for selectively activating output signal line SL1. Local decoder selecting circuit 13 is responsive to jth and j+1th column address signals CAj and CAj+1 for generating a selecting signal for selecting local decoder controlling circuit 10b. As a result, two input signals at a high level are applied only to the NAND gate in divided word line driving circuit 30. Accordingly, divided word line WL1 is driven or activated by driving circuit 30.

Figure 5A:
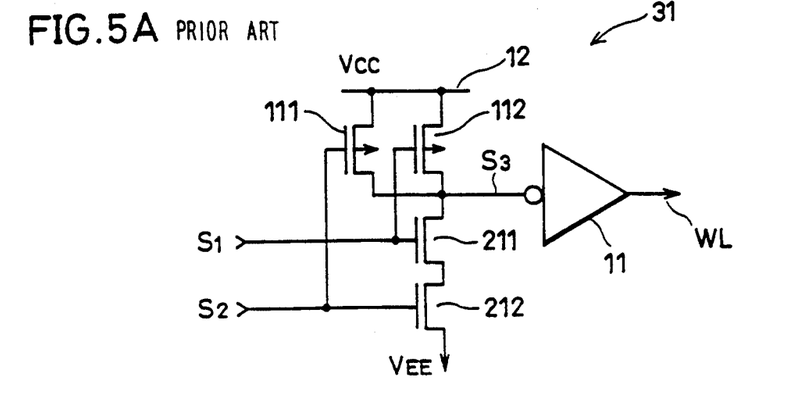
FIGS. 5A, 5B, and 5C are circuit diagrams of conventional word line driving circuits.
Figure 5B:
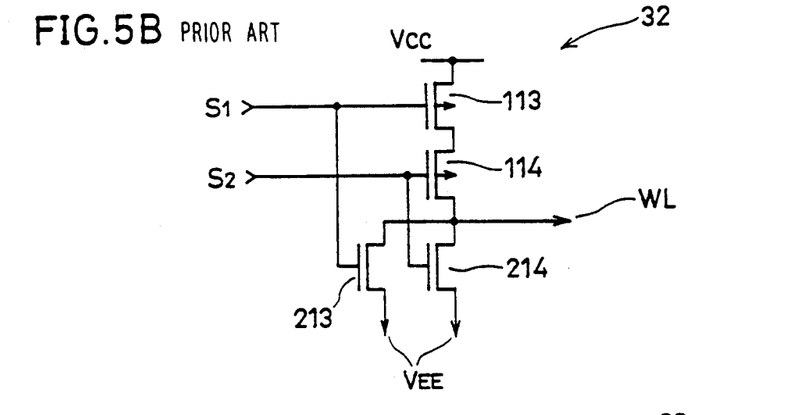
Figure 5C:
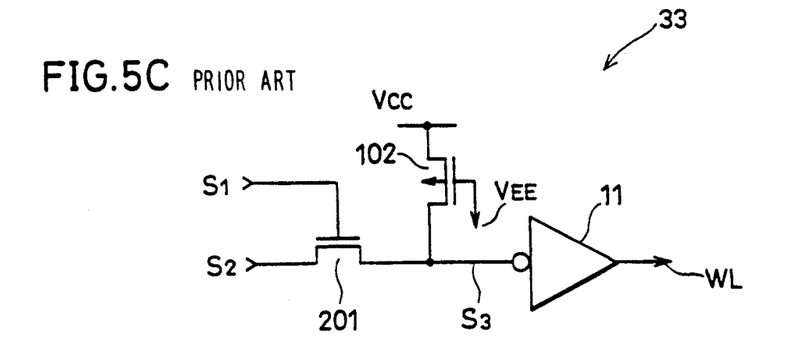

FIGS. 5A, 5B, and 5C are circuit diagrams illustrating conventional divided word line driving circuits 31, 32, and 33. Each of circuits 31, 32 and 33 is applied as divided word line driving circuit 30 illustrated in FIG. 4. One and the other of output signals of global decoder 1 and local decoder controlling circuit 10b illustrated in FIG. 4 are applied respectively as input signals S1 and S2 to each of circuits 31 to 33.

Referring to FIG. 5A, divided word line driving circuit 31 includes PMOS transistors 111 and 112, NMOS transistors 211 and 212, and an inverter 11, and first and second supply potentials Vcc and $V_{EE}$ are applied thereto. Transistors 112 and 211 are connected so that their gates receive first input signal S1. Transistors 111 and 212 are connected so that their gates receive second input signal S2. The output of inverter 11 is connected to a divided word line WL.

Referring to FIG. 5B, divided word line driving circuit 32 includes PMOS transistors 113 and 114 and NMOS transistors 213 and 214, and first and second supply potentials Vcc and $V_{EE}$ are applied thereto. Transistors 113 and 213 are connected so that their gates receive first input signal S1. Transistors 114 and 214 are connected so that their gates receive second input signal S2.

Referring to FIG. 5C, divided word line driving circuit 33 includes an NMOS transistor 201 as a transfer gate, a PMOS transistor 102 for charging the output electrode of transistor 201, and an inverter 11 for driving a word line WL. First input signal S1 is applied to the gate of transistor 201. Second input signal S2 is applied through transistor 201 to the input of inverter 11. The gate of transistor 102 is connected to the second supply potential $V_{EE}$, so that transistor 102 is always brought to ON state. The circuit illustrated in FIG. 5C is disclosed in, a paper titled "A 15ns 4Mb CMOS SRAM." (ISSCC DIGEST OF TECHNICAL PAPERS, pp. 126–127; Feb. 1990) by Aizaki S., et. al.

FIGS. 6A to 6E are circuit diagrams of inverters applicable in a divided word line driving circuit. Specifically, inverters 11a to 11e illustrated in FIGS. 6A to 6E are applicable as inverter 11 illustrated in FIG. 5A or FIG. 5C.

Figure 6A:
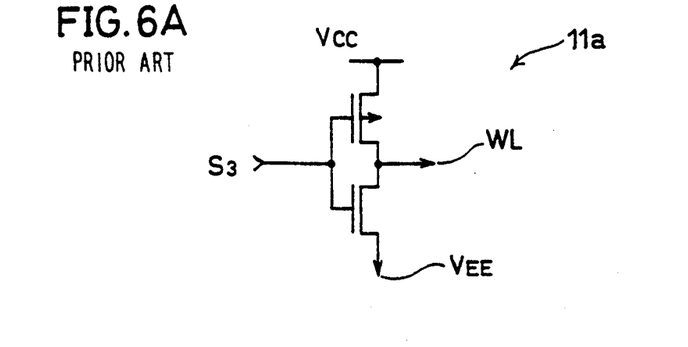
FIGS. 6A to 6E are circuit diagrams of inverters applicable to a divided word line driving circuit.
Figure 6B:
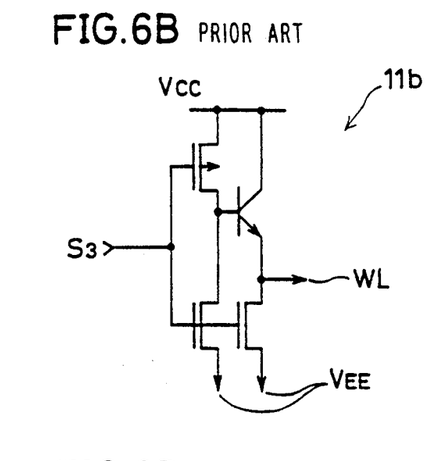
Figure 6C:
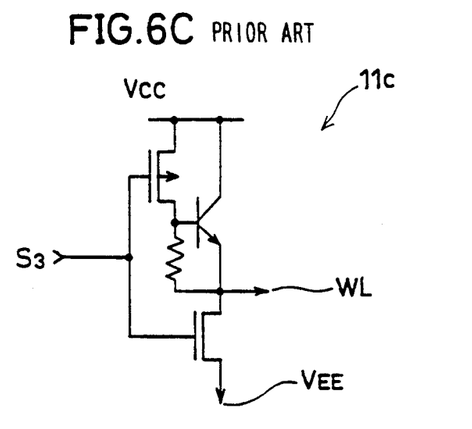
Figures 6D, 6E:
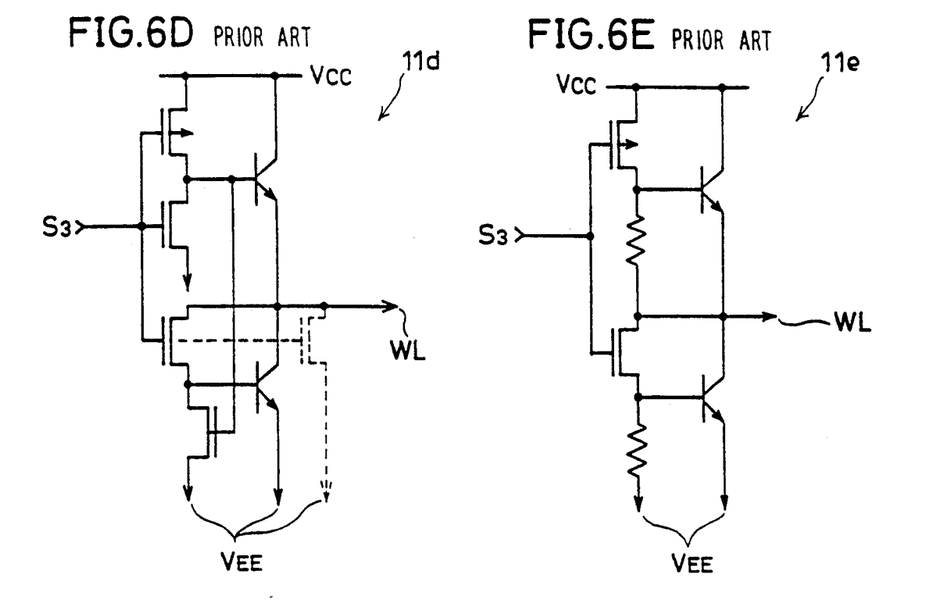

Following problems are pointed out with respect to conventional divided word line driving circuits 31, 32 and 33. The number of transistors required for constituting driving circuit 31 illustrated in FIG. 5A is larger in comparison with those for the other driving circuits 32 and 33. Specifically, even if inverter 11a illustrated in FIG. 6A is used as inverter 11, six transistors in total are required. This means that the region occupied by local decoders on a semiconductor substrate is increased.

Divided word line driving circuit 32 illustrated in FIG. 5B is implemented with four transistors, so that the occupied region on a semiconductor substrate is smaller than that of circuit 31 illustrated in FIG. 5A. However, in order to obtain the same word line driving capability as that of circuit 31 illustrated in FIG. 5A, it is necessary to increase the gate width of each of transistors 113, 114, 213, and 214. The gate capacitance of each of transistors 113, 114, 213, and 214 is increased, so that it is necessary to considerably increase the load driving capability of the circuits which drive divided word line driving circuit 32, i.e. global decoder 1 and local decoder controlling circuits 10a and 10b.

In a case where inverter 11a illustrated in FIG. 6A is applied, divided word line driving circuit 33 illustrated in FIG. 5C requires four transistors. In addition, inverter 11 for driving word line WL is provided, so that it is not necessary to increase the gate width of each of transistors 102 and 201. Accordingly, it is possible to obtain word line driving capability for driving a divided word line without increasing the load driving capability of global decoder 1 and local decoder controlling circuits 10a and 10b. However, problems as described in the following have arisen.

In divided word line driving circuit 33 illustrated in FIG. 5C, rising of an input signal S3 of inverter 11 is caused only by transistor 102. In order to make rising of input signal S3 more rapid, it is necessary to reduce the on resistance by setting the gate width of transistor 102 larger. However, reducing the on resistance of transistor 102 delays falling of signal S3 and causes increase in current consumption. Accordingly, it is pointed out that the on resistance of transistor 102 must be set to an appropriate value which is not so low in view of a required operation speed and current consumption.

SUMMARY OF THE INVENTION

An object of the present invention is to increase the driving speed of a word line driving circuit provided in a small occupied region on a substrate of a semiconductor memory device.

Another object of the present invention is to increase the driving speed of a word line driving circuit in a semiconductor memory device employing a divided word line method.

Still another object of the present invention is to increase the driving speed of a word line driving circuit provided in a small occupied region on a substrate of a SRAM.

To be brief, a semiconductor memory device according to the present invention includes a plurality of memory cell regions each including a plurality of word lines, a first selecting signal generating circuit responsive to a more significant bit of an externally applied address signal for generating a first selecting signal for selecting one of the plurality of memory cell regions, a second selecting signal generating circuit responsive to a less significant bit of the address signal for generating a second selecting signal for selecting one word line in each memory cell region, and a plurality of word line driving circuits each responsive to first and second selecting signals for driving a corresponding word line in one of the plurality of memory cell region. Each word line driving circuit includes a transfer gate circuit responsive to one of the first and second selecting signals for transmitting the other one of the first and second selecting signals, a driving circuit responsive to the potential at an output node of the transfer gate circuit for driving a corresponding word line, a resistor connected between a supply potential and the output node of the transfer gate circuit, and an accelerating circuit responsive to the second selecting signal for accelerating charging or discharging of the output node of the transfer gate circuit.

Since the accelerating circuit is provided, charging or discharging of the output node of the transfer gate circuit is accelerated in operation. Therefore, the word line driving speed of the word line driving circuits is increased.

According to another aspect of the present invention, a semiconductor memory device includes a plurality of memory cell regions each including a plurality of word lines, a first selecting signal generating circuit responsive to a more significant bit of an externally applied address signal for generating a first selecting signal for selecting one of the plurality of memory cell regions, a second selecting signal generating circuit responsive to a less significant bit of the address signal for generating a second selecting signal for selecting one word line in each memory cell region, and a plurality of word line driving circuits each responsive to the first and second selecting signals for driving a corresponding word line in one of the plurality of memory cell regions. Each word line driving circuit includes first and second input nodes for receiving one and the other of the first and second selecting signals, respectively, first and second switching elements connected in series between the first input node and a supply potential and turned on in a complementary manner in response to the second selecting signal applied through the second input node, a third switching element connected between the first input node and a corresponding word line and turned on in response to the potential at a common connection node of the first and second switching elements. A corresponding word line is connected to the common connection node of the first and second switching elements.

Since the word line driving circuit is implemented with only three switching elements, the occupied region on a semiconductor substrate is reduced in operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
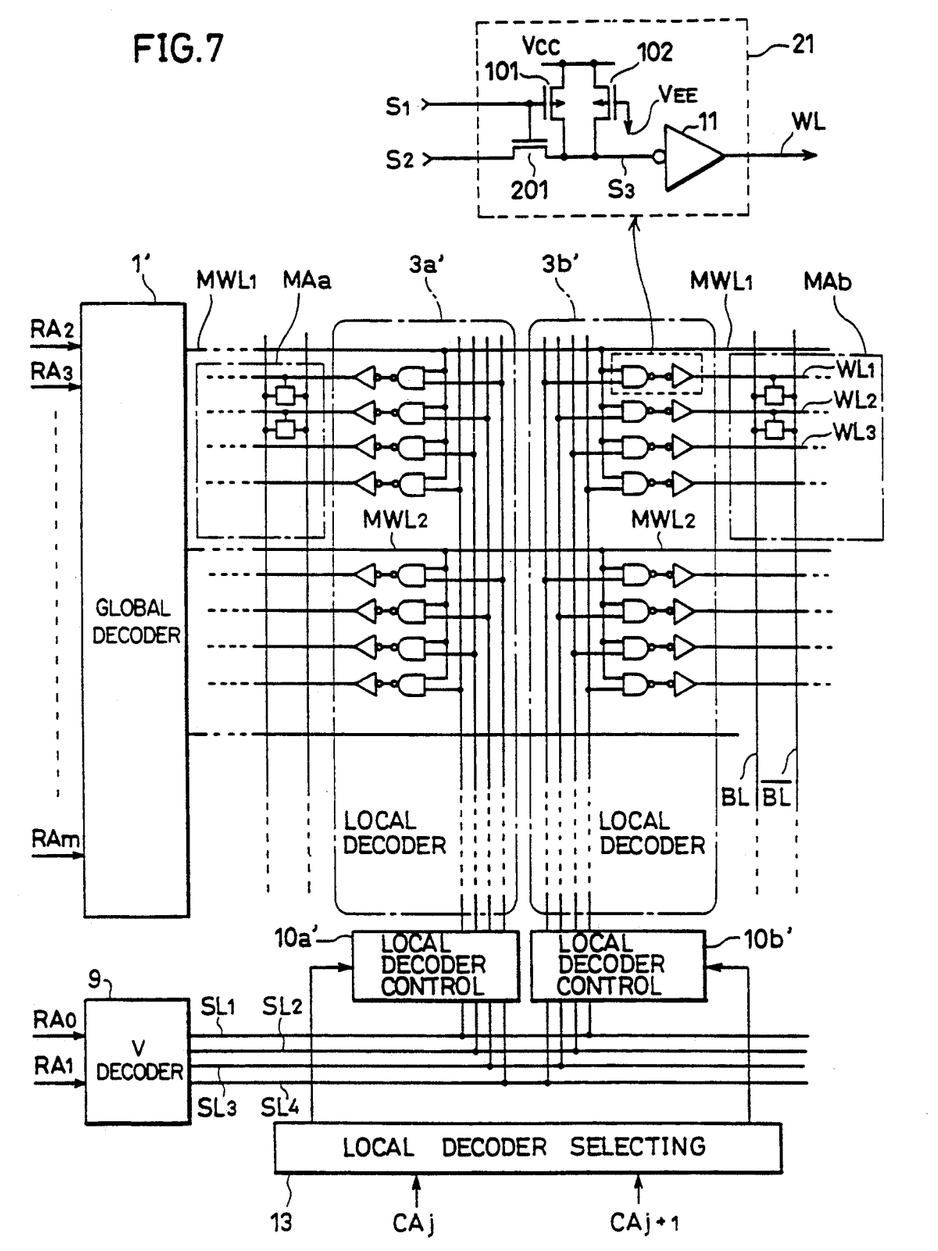
FIG. 7 is a circuit diagram of a divided word line driving circuit illustrating an embodiment of the present invention.

Referring to FIG. 7, a divided word line driving circuit 21 includes an NMOS transistor 201 as a transfer gate, PMOS transistors 101 and 102 connected in parallel between a first supply potential Vcc and the output electrode of transistor 201, and an inverter 11 for driving a divided word line WL. Transistors 101 and 201 are connected so that their gates receive a first input signal S1. A second input signal S2 is applied through transistor 201 to the input of inverter 11. The gate of transistor 102 is connected to a second supply potential $V_{EE}$, so that transistor 102 is normally on. Divided word line WL is connected to the output of inverter 11. The other divided word line driving circuits in local decoders $3a'$, $3b'$ have the same circuit configuration as that of circuit 21. One of the output signals of a global decoder $1'$ and a local decoder controlling circuit $10b$, is applied as input signal S1, and the other one is applied as input signal S2.

Now, operation of divided word line driving circuit 21 will be described. First, in a case where input signal S1 at a high level and input signal S2 at a low level are applied, transistor 201 is turned on, and the other transistor 101 is turned off. The potential at the input of inverter 11, i.e. a signal S3 is lowered to a potential determined by the ratio of the on resistance of transistor 102 to that of transistor 201. Transistor 102 has a small gate width, so that its on resistance is high. Accordingly, input signal S3 of inverter 11 is lowered approximately to second supply potential $V_{EE}$. Consequently, inverter 11 generates a signal at a high level and activates divided word line WL Now, in a case where input signals S1 and S2 both at the low level are applied, transistor 201 is turned off, and transistor 101 is turned on. Accordingly, the input of inverter 11 is charged by transistors 101 and 102 in a short time. In other words, signal S3 rises at high speed, so that the potential of word line WL is made to fall more rapidly by inverter 11. Specifically, word line WL is rapidly brought to an inactivated state.

In a case where input signals S1 and S2 both at the high level are applied, transistor 201 is turned on, and transistor 101 is turned off. Accordingly, the input of inverter 11 is charged through transistors 102 and 201 and brought to a high level. As a result, word line WL is brought to the inactivated state (a low potential) by inverter 11.

It is pointed out that in a case where divided word line driving circuit 21 illustrated in FIG. 7 is applied to a SRAM, it is necessary to change the logics for selecting a word line to be activated in global decoder $1'$ and local decoder controlling circuits $10a'$ and $10b'$ from the ones in FIG. 4 to another. It is because driving circuit 21 illustrated in FIG. 7 activates a word line WL1 in response to input signal S1 at the high level and input signal S2 at the low level while word line driving circuit 30 illustrated in FIG. 4 activates word line WL1 in response to two input signals at the high level.

Divided word line driving circuit 21 illustrated in FIG. 7 has advantages as described in the following as compared to the conventional driving circuits. First, the number of transistors constituting driving circuit 21 is reduced by one as compared to that of circuit 31 illustrated in FIG. 5A. In addition, it is pointed out that driving circuit 21 illustrated in FIG. 7 reduces the load driving capability required of global decoder $1'$ and local decoder controlling circuits $10a'$ and $10b'$ as compared to that of driving circuits 31 and 32 illustrated in FIGS. 5A and 5B. Although the number of transistors used in driving circuit 21 is increased by one as compared to that of circuit 32 illustrated in FIG. 5B, driving circuit 21 can have large word line driving capability because of inverter 11 included in it.

Compared to conventional driving circuit 33 illustrated in FIG. 5C, driving circuit 21 includes an additional transistor 101 operated in response to first input signal S1. In addition to transistor 102 which is always on, transistor 101 contributes to making the potential of the output electrode of transistor 201 rise, so that the potential of divided word line WL is lowered more rapidly. In other words, driving circuit 21 is capable of inactivating divided word line WL in a short time. In addition, it is pointed out that the occupied area on a semiconductor substrate of transistors 101 and 102 is approximately the same as that of transistor 102 illustrated in FIG. 5C. Specifically, although the number of transistors in driving circuit 21 illustrated in FIG. 7 is increased by one as compared to that of circuit 33 illustrated in FIG. 5C, driving circuit 21 has approximately the same occupied area as that of circuit 33.

Figure 8:
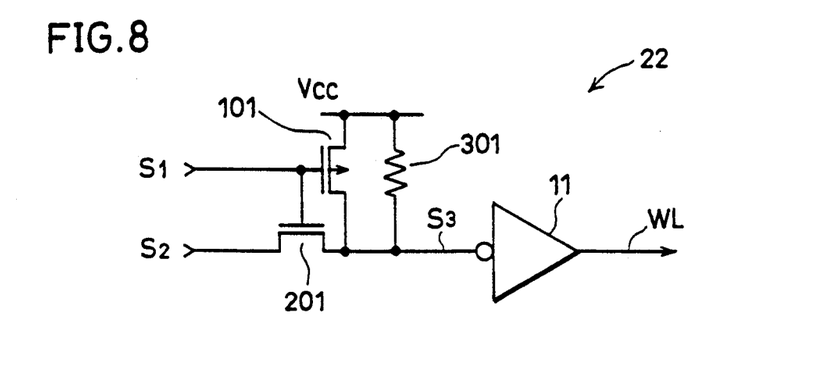
FIG. 8 is a circuit diagram of a divided word line driving circuit illustrating another embodiment of the present invention.

As illustrated in FIG. 8, it is possible to substitute a resistor 301 for transistor 102 in driving circuit 21 illustrated in FIG. 7. Resistor 301 is formed of, for example, a diffused resistor or polycrystalline silicon. In addition, it is pointed out that the various inverters 11a to 11e illustrated in FIGS. 6A to 6E are applicable as inverter 11 illustrated in FIGS. 7 and 8.

Figure 9:
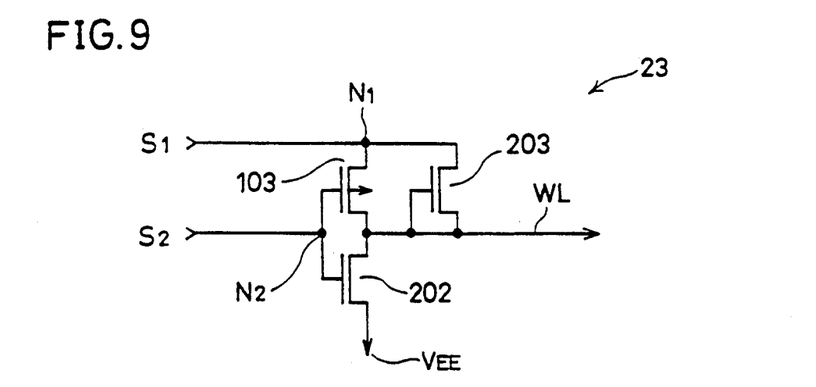
FIG. 9 is a circuit diagram of a divided word line driving circuit illustrating still another embodiment of the present invention.

Still another embodiment according to the present invention is illustrated in FIG. 9. Referring to FIG. 9, a divided word line driving circuit 23 includes a PMOS transistor 103 and an NMOS transistor 202 connected in series between a first input node N1 and a supply potential $V_{EE}$ and an NMOS transistor 203 connected between node N1 and a divided word line WL. Transistors 103 and 202 have their gates connected to a second input node N2. First and second input signals S1 and S2 are applied through nodes N1 and N2, respectively. Word line WL is connected to a common connection node of transistors 103 and 202. The gate of transistor 203 is connected to word line WL.

Now, operation will be described. In a case where an input signal S1 at a high level and an input signal S2 at a low level are applied, transistor 103 is turned on and transistor 202 is turned off. Accordingly, the potential of divided word line WL is brought to a high level through transistor 103, and word line WL is activated.

In a case where input signals S1 and S2 both at the low level are applied, transistor 202 is turned off, and transistor 103 is turned on. Accordingly, the divided word line is discharged by transistors 103 and 203, and the potential of word line WL is brought to a low level (inactivated).

Further, in a case where input signals S1 and S2 both at the high level are applied, transistor 103 is turned off and transistor 202 is turned on. Diode connected transistor 203 is brought to OFF state. Accordingly, the potential of divided word line WL is brought to a low level (inactivated).

Divided word line driving circuit 23 illustrated in FIG. 9 discharge divided word line WL with transistors 103 and 203, so that it is particularly effective in making divided word line WL fall in a short time. In addition, the number of transistors constituting driving circuit 23 is smaller than those of conventional driving circuits 31, 32, and 33, so that it is possible to form a local decoder employing circuit 23 in a smaller occupied region in a semiconductor substrate.

Figure 10:
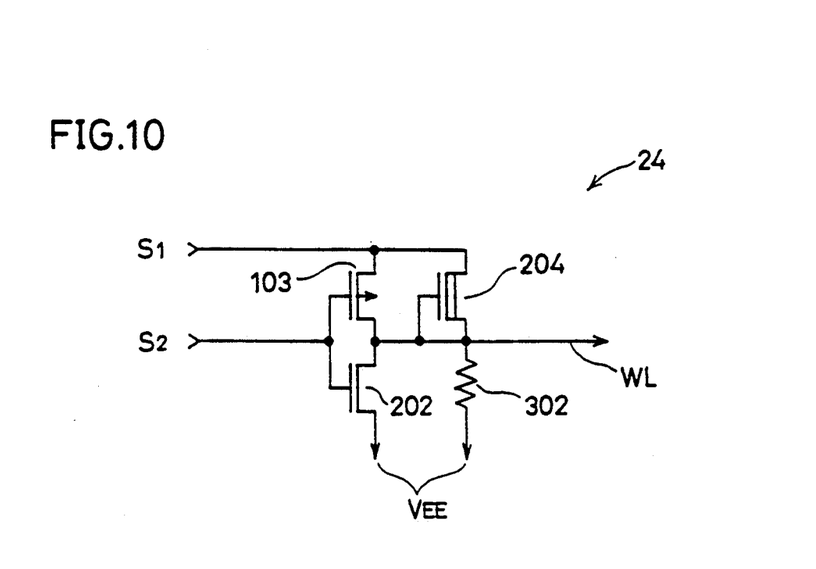
FIG. 10 is a circuit diagram of a divided word line driving circuit illustrating a further embodiment of the present invention.

A further embodiment according to the present invention is illustrated in FIG. 10. Referring to FIG. 10, a divided word line driving circuit 24 includes an NMOS transistor 204 having a lower threshold voltage substituting for transistor 203 as compared to circuit 23 illustrated in FIG. 9. In addition, a resistor 302 is connected between a divided word line WL and a supply potential $V_{EE}$. Transistor 204 having a lower threshold voltage is used, so that when an input signal S1 at a low level is applied, it is possible to bring divided word line WL to a lower potential than in circuit 23 illustrated in FIG. 9. In addition, resistor 302 is provided, so that the potential of divided word line WL is made to fall approximately to supply potential $V_{EE}$. It is pointed out that resistor 302 has a value of a degree not preventing divided word line WL from falling.

Figure 11:
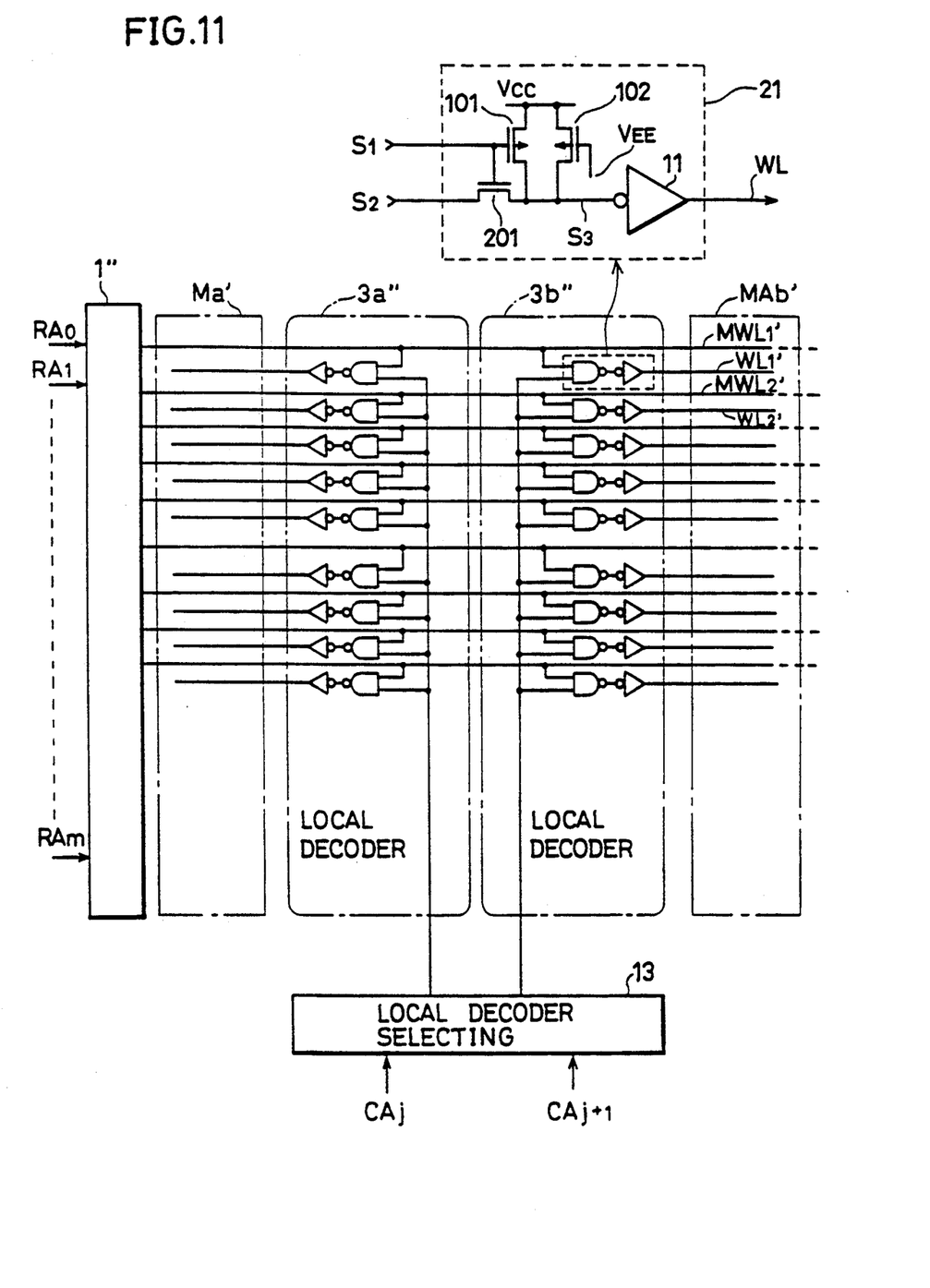
FIG. 11 is a circuit diagram of a divided word line driving circuit illustrating a still further embodiment of the present invention.

A still further embodiment according to the present invention is illustrated in FIG. 11. No V decoder is provided in the circuit illustrated in FIG. 11. A global decoder 1" selectively activates one of main word lines MWL1', MWL2', . . . in response to all bits RA0 to RAm of a row address signal. Each word line driving circuit selectively activates or drives a corresponding one of divided word lines WL1', WL2', . . . in response to corresponding one main word line signal and one of two selecting signals applied from a local decoder selecting circuit 13. It is pointed out that divided word line driving circuits 22, 23, and 24 illustrated in FIGS. 8, 9, and 10 are also applicable as a substitute for circuit 21.

As described above, divided word line driving circuit 21 illustrated in FIG. 7 includes transistor 101, so that it is possible to make the potential of the output electrode of transistor 201 rise in a shorter time. In other words, transistor 101 contributes to accelerating charging of the input of inverter 11. As a result, the potential of divided word line WL can be made to fall in a shorter time, so that speed up progress of accessing in a SRAM is achieved. In addition, it is pointed out that divided word line driving circuit 23 illustrated in FIG. 9 is implemented with the least number of transistors, so that it contributes to large scale integration of a SRAM.

While examples in which the present invention is applied to a SRAM employing the divided word line method has been described above, it is pointed out that the present invention is widely applicable to semiconductor memories in general.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a plurality of memory cell regions each including a plurality of word lines;
    first selecting signal generating means responsive to a more significant bit of an externally applied address signal for generating a first selecting signal for selecting one of said plurality of memory cell regions;
    second selecting signal generating means responsive to a less significant bit of said externally applied address signal for generating a second selecting signal for selecting one word line in each memory cell region;
    a plurality of word line driving circuits each connected to a corresponding word line in one of said plurality of memory cell regions responsive to the first and second selecting signals for driving said corresponding one word line;
    each of said word line driving circuits including;
        transfer gate means having an output node responsive to one of the first and second selecting signals for transmitting the other one of the first and second selecting signals through said output node;
        driving means responsive to the potential at the output node of said transfer gate means for driving said corresponding one word line;
        resistor means connected between a first supply potential and the output node of said transfer gate means; and
        accelerating means connected between said first supply potential and the output node of said transfer gate means responsive to said one of the first and second selecting signals for accelerating charging or discharging of the output node of said transfer gate means.

2. The semiconductor memory device according to claim 1, wherein
said first selecting signal generating means includes more significant address decoder means for decoding a more significant bit of said externally applied address signal to generate the first selecting signal for selecting one of said plurality of memory cell regions, and
said second selecting signal generating means includes less significant address decode means for decoding a less significant bit of said externally applied address signal to generate the second selecting signal for selecting one word line in each memory cell region.

3. The semiconductor memory device according to claim 2, further comprising a plurality of main word lines connected to said plurality of memory cell regions, respectively, wherein
said more significant address decoder means includes a global decoder for decoding a more significant bit of said externally applied address signal to selectively activate one of said plurality of main word lines.

4. The semiconductor memory device according to claim 1, wherein said driving means includes inverter means for inverting the potential signal at the output node of said transfer gate means to drive said corresponding one word line.

5. The semiconductor memory device according to claim 1, wherein
said transfer gate means includes a first field effect transistor of a first conductivity type having an input electrode, an output electrode, and a gate electrode, and
said first field effect transistor has the gate electrode connected to receive one of the first and second selecting signals, the input electrode connected to receive the other one of the first and second selecting signals, and the output electrode connected to the input of said driving means.

6. The semiconductor memory device according to claim 5, wherein said accelerating means includes a second field effect transistor of a second conductivity type connected between said supply potential and the output node of said transfer gate means and having a gate electrode connected to receive the one of the first and second selecting signals.

7. The semiconductor memory device according to claim 6, wherein said resistor means includes a third field effect transistor of the second conductivity type connected between said first supply potential and the output node of said transfer gate means and having a gate connected to a second supply potential.

8. The semiconductor memory device according to claim 7, wherein
said inverter means includes a fourth field effect transistor of the second conductivity type and a fifth field effect transistor of the first conductivity type connected in series between said first and second supply potentials, and
said fourth and fifth field effect transistors have their gates connected to the output node of said transfer gate means.

9. The semiconductor memory device according to claim 1, wherein said semiconductor memory device includes a static random access memory device (SRAM).

10. A word line driving circuit responsive to first and second selecting signals for driving a selected word line, comprising:
transfer gate means having an output node responsive to the first selecting signal for transmitting the second selecting signal through said output node;
driving means responsive to the potential at the output node of said transfer gate means for driving said word line;
resistor means connected between a supply potential and the output node of said transfer gate means; and
accelerating means connected between said supply potential and the output node of said transfer gate means responsive to the first selecting signal for accelerating charging or discharging of the output node of said transfer gate means.

11. A semiconductor memory device, comprising:
a plurality of memory cell regions each including a plurality of word lines;
first selecting signal generating means responsive to a more significant bit of an externally applied address signal for generating a first selecting signal for selecting one of said plurality of memory cell regions;
second selecting signal generating means responsive to a less significant bit of said externally applied address signal for generating a second selecting signal for selecting one word line in each memory cell region; and
a plurality of word line driving circuits each connected to corresponding one word line in one of said plurality of memory cell regions responsive to the first and second selecting signals for driving said corresponding one word line;
each of said word line driving circuits including;
first and second input nodes for receiving one and the other of the first and second selecting signals, respectively,
first and second switching elements connected in series between said first input node and a supply potential and turned on in a complementary manner in response to the second selecting signal applied through said second input node,
said corresponding one word line being connected to a common connection node of said first and second switching elements, and
a third switching element connected between said first input node and said corresponding one word line and turned on in response to the potential at the common connection node of said first and second switching elements.

12. The semiconductor memory device according to claim 11, wherein
said first switching element includes a first field effect transistor of a first conductivity type,
said second switching element includes a second field effect transistor of a second conductivity type opposite to the first conductivity type, and
said first and second field effect transistors are connected in series between said first input node and supply potential and have the gates connected to said second input node.

13. The semiconductor memory device according to claim 11, wherein said semiconductor memory device includes a static random access memory device (SRAM).

14. A semiconductor memory device, comprising:

a plurality of memory cell regions each including a plurality of word lines;

first selecting signal generating means responsive to a more significant bit of an externally applied address signal for generating a first selecting signal for selecting one of said plurality of memory cell regions;

second selecting signal generating means responsive to a less significant bit of said externally applied address signal for generating a second selecting signal for selecting one word line in each memory cell region; and a plurality of word line driving circuits each connected to corresponding one word line in one of said plurality of memory cell regions responsive to the first and second selecting signals for driving said corresponding one word line;

each of said word line driving circuits including:

first and second switching elements connected in series between said first input node and a supply potential and turned on in a complementary manner in response to the second selecting signal applied through said second input node, said corresponding one word line being connected to a common connection node of said first and second switching elements, and a third switching element connected between said first input node and said corresponding one word line and turned on in response to the potential at the common connection node of said first and second switching elements, wherein said first switching element includes a first field effect transistor of a first conductivity type, said second switching element includes a second field effect transistor of a second conductivity type opposite to the first conductivity type, said first and second field effect transistors are connected in series between said first input node and supply potential and have the gates connected to said second input node, and said third switching element includes a third field effect transistor of the second conductivity type connected between said first input node and said corresponding one word line and having the gate connected to the common connection node of said first and second field effect transistors.

15. The semiconductor memory device according to claim 14, further comprising resistor means connected between the common connection node of said first and second field effect transistors and said supply potential, wherein said third field effect transistor has a lower threshold voltage as compared to that of said second field effect transistor.

16. A word line driving circuit responsive to first and second selecting signals for driving a selected word line, comprising:

first and second input nodes for receiving the first and second selecting signals, respectively;

first and second switching elements connected in series between said first input node and a supply potential and turned on in a complementary manner in response to the second selecting signal applied through said second input node;

said word line being connected to a common connection node of said first and second switching elements; and a third switching element connected between said first input node and said word line and turned on in response to the potential at the common connection node of said first and second switching elements.

17. A semiconductor memory device, comprising:

a plurality of memory cell array blocks each including a plurality of memory cells;

each of said memory cell arrays including a plurality of memory cell regions each including one or a plurality of word lines;

first selecting signal generating means for generating a first selecting signal for selecting one of said plurality of memory cell regions;

second selecting signal generating means for generating a second selecting signal for selecting one of said plurality of memory cell array blocks;

a plurality of word line driving circuits for driving the one or plurality of word lines in said memory cell regions in response to the first selecting signal and the second selecting signal;

each of said word line driving circuits including;

transfer gate means having an output node responsive to one of the first and second selecting signals for transmitting the other one of the first and second selecting signals through said output node;

driving means responsive to the potential at the output node of said transfer gate means for driving said corresponding one word line;

resistor means connected between a first supply potential and the output node of said transfer gate means; and accelerating means connected between said first supply potential and the output node of said transfer gate means responsive to said one of the first and second selecting signals for accelerating charging or discharging of the output node of said transfer gate means.

18. A semiconductor memory device, comprising:

a plurality of memory cell array blocks each including a plurality of memory cells;

each of said memory cell arrays including a plurality of memory cell regions each including one or a plurality of word lines;

first selecting signal generating means for generating a first selecting signal for selecting one of said plurality of memory cell regions;

second selecting signal generating means for generating a second selecting signal for selecting one of said plurality of memory cell array blocks;

a plurality of word line driving circuits for driving the one or plurality of word lines in said memory cell regions in response to the first selecting signal and the second selecting signal;

each of said word line driving circuits including;

first and second input nodes for receiving one and the other of the first and second selecting signals, respectively, first and second switching elements connected in series between said first input node and a supply potential and turned on in a complementary manner in response to the second selecting signal applied through said second input node, said corresponding one word line being connected to a common connection node of said first and second switching elements, and a third switching element connected between said first input node and said corresponding one word line and turned on in response to the potential at the common connection node of said first and second switching elements.

* * * * *